United States Patent [19]
Eguchi

[11] Patent Number: 5,373,192
[45] Date of Patent: Dec. 13, 1994

[54] ELECTROMIGRATION RESISTANCE METAL INTERCONNECT

[75] Inventor: Koji Eguchi, Hyogo, Japan

[73] Assignee: Mitsubishi Denki Kabushiki Kaisha, Tokyo, Japan

[21] Appl. No.: 936,060

[22] Filed: Aug. 28, 1992

Related U.S. Application Data

[63] Continuation of Ser. No. 708,037, May 31, 1991, abandoned.

[30] Foreign Application Priority Data

Jun. 26, 1990 [JP] Japan ................... 2-167282

[51] Int. Cl.$^5$ ............... H01L 23/48; H01L 29/44; H01L 29/52; H01L 29/60
[52] U.S. Cl. ................... 257/774; 257/750; 257/754; 257/758; 257/756; 257/765; 257/767
[58] Field of Search ............ 357/59, 65, 71; 257/700, 734, 750, 754, 758, 765, 767, 774

[56] References Cited

U.S. PATENT DOCUMENTS

| | | | |
|---|---|---|---|
| 4,744,858 | 5/1988 | McDavid et al. | 357/65 |
| 4,800,177 | 1/1989 | Nakamae . | |
| 4,922,320 | 5/1990 | McDavid et al. | 357/71 |
| 4,945,070 | 7/1990 | Hsu | 357/59 |

FOREIGN PATENT DOCUMENTS

| | | | |
|---|---|---|---|
| 58-202552 | 11/1983 | Japan | 257/767 |
| 62-15819 | 1/1987 | Japan . | |
| 62-73711 | 4/1987 | Japan | 257/767 |
| 62-123716 | 6/1987 | Japan . | |
| 64-37050 | 2/1989 | Japan . | |
| 1-37051A | 2/1989 | Japan . | |
| 1-238013 | 9/1989 | Japan . | |

OTHER PUBLICATIONS

T. Kobayashi et al, "Epitaxial Growth of Al on Si by Gas-Temperature-Controlled Chemical Vapor Deposition", Japanese Journal of Applied Physics, vol. 27, No. 9, Sep. 1988, pp. L1775–L1777.

*Primary Examiner*—Andrew J. James
*Assistant Examiner*—Carl Whitehead, Jr.
*Attorney, Agent, or Firm*—Lowe, Price, LeBlanc & Becker

[57] ABSTRACT

A semiconductor device is provided which includes a conductive layer, an insulating film formed on the surface of the conductive layer, and a conductive metal interconnection layer formed on the insulating film and electrically connected to the conductive layer through a contact hole formed in a predetermined position of the insulating film. The conductive metal interconnection and the surface of the conductive layer are directly joined together and a silicon layer including a single crystal or polycrystalline silicon having a grain size of at least about 10 μm is interposed between the conductive metal interconnection layer and the insulating film. The conductive metal interconnection layer becomes a single crystal or a polycrystal having a grain size of about 10 μm or above under the influence of the crystalline properties of the underlying crystal of the silicon layer. Therefore, in the conductive metal interconnection layer in the entire region including the inside portion of the contact hole, essentially no grain boundaries exist. Thus, electromigration of conductive metal ions is controlled.

9 Claims, 8 Drawing Sheets

ELECTROMIGRATION RESISTANCE METAL INTERCONNECT

This application is a continuation of application Ser. No. 07/708,037 filed May 31, 1991 now abandoned.

BACKGROUND OF THE INVENTION

1. Field of the Invention

The invention relates generally to semiconductor devices and manufacturing methods thereof and, more particularly, to semiconductor devices in which a lifetime against electromigration of a conductive metal interconnection including an electric interconnecting portion may be increased and manufacturing methods thereof.

2. Description of the Background Art

Generally, thin aluminum film is largely used as an electrode interconnection material of a semiconductor device represented by an integrated circuit using silicon. With the advancement of miniaturization in semiconductor devices, a multilayer interconnection has been often used for interconnection between electrodes. In the multilayer interconnection, an aluminum film is formed on an impurity diffusion layer or a conductive layer such as a polysilicon layer over the surface of a silicon substrate with an insulating film interposed therebetween by a CVD method or a sputtering method, and the aluminum thin film and the conductive layer underlying it are electrically connected to each other through a contact hole formed in the insulating film.

A description will now be provided of a structure of a conventional semiconductor device having an interconnection structure including an electric connecting portion, and manufacturing processes thereof, referring to FIGS. 1, 2, 3A to 3D.

FIG. 1 shows an example of a typical cross-sectional structure of a conventional bipolar transistor. The bipolar transistor shown in the figure has an n-type layer 3 having a high concentration formed in part of a p-type region 2 on the surface of an n-type semiconductor substrate 1. The p-type region 2 and the high concentration n-type layer 3 are electrically connected to aluminum interconnections 5, 6 through contact holes formed in predetermined positions of an oxide insulating film formed on the surface of the semiconductor substrate 1, respectively. The aluminum interconnections 5, 6 and a conductive layer 7 on the reverse surface of the semiconductor substrate 1 are connected to a base terminal (B), an emitter terminal (E), and a collector terminal (C) of the bipolar transistor, respectively. The aluminum interconnections 5, 6 having such a structure of the semiconductor device are directly in contact with the amorphous oxide insulating film 4 in most part of their under surfaces.

FIG. 2 shows a typical cross-sectional structure of a conventional MOS (Metal Oxide Semiconductor) type field-effect transistor. The MOS type field-effect transistor has a gate electrode 13 and source/drain regions 14 doped with impurities formed on an active region isolated and insulated by a field insulating film 12 on the surface of a semiconductor substrate 11. The source/drain regions 14 are electrically connected to aluminum interconnection layer 17 through contact holes 16 formed in an oxide insulating film 15. In this structure as well, the aluminum interconnection layer 17, over most of its under surface, is in contact with the oxide insulating film 15 having an amorphous structure and it is in contact with the semiconductor substrate 11 having a crystalline structure such as single crystal silicon only in its contact portion with the source/drain regions 14.

A description will now be provided of a process of forming an interconnection on a semiconductor substrate represented by the aluminum interconnections 5, 6 and the like of the planar type bipolar transistor shown in FIG. 1, referring to FIGS. 3A to 3D.

Firstly, an oxide insulating film 22 such as $SiO_2$ is deposited on a semiconductor substrate 21 by a CVD method or the like (see FIG. 3A). After that, a contact hole 23 is apertured in a predetermined position of the oxide insulating film 22 by a photolithography and etching (see FIG. 3B). Then, an aluminum thin film 24 is formed on the surface of the oxide insulating film 22 including the inner surface of the contact hole 23 by the CVD method or the sputtering method or the like (see FIG. 3C). After that, the aluminum thin film 24 is selectively removed and an aluminum interconnection layer 25 is patterned by the photolithography and etching (see FIG. 3D).

In the above-mentioned process, in forming the aluminum thin film 24, most of the underlying portion thereof is formed on the oxide insulating film 22 having an amorphous structure, so that the aluminum thin film 24 formed has an amorphous structure or a polycrystalline structure in which small crystal grains are formed having a diameter of about 1 $\mu$m or below under the influence of the underlying portion. Therefore, there is a problem that the amorphous characteristic results in degradation of the aluminum interconnection layer 25 due to electromigration.

The electromigration is a phenomenon in which when a current flows through the aluminum interconnection layer, migrating free electrons collide with aluminum atoms, so that the aluminum atoms flow particularly along the grain boundary in the direction of the migration of the electrons. A cavity formed after the aluminum atoms leave is expanded by the electromigration, the aluminum interconnection layer becomes thin and its resistance becomes large, or it is electrically disconnected. Therefore, the lifetime of the semiconductor device against electromigration becomes shortened. The electromigration also causes the aluminum atoms which migrated along the grain boundary to accrete in some places, generating a hillock which is an unnecessary lump, so that a defect such as a short-circuit is sometimes caused between adjacent aluminum interconnections in the vicinity.

A conventional technique for solving the above-mentioned problem of the electromigration is disclosed, for example, in Japanese Patent Laying-Open No. 64-37050, in which an aluminum interconnection layer 33 is changed to be a single crystal by interposing a single crystal silicon layer 34 as an underlying portion of the aluminum interconnection layer 33 to be formed on an oxide insulating film 32 over a semiconductor substrate 31 as shown in FIG. 4. In the structure shown in FIG. 4, a single crystal $CoSi_2$ film 36 is formed for reducing the resistance of a contact portion in the vicinity of a region in which at least the single crystal silicon layer 34 is in contact with the surface of the semiconductor substrate 31 through a contact hole 35. In the Japanese Patent Laying-Open No. 64-37050, a MOS type field-effect transistor shown in FIG. 5 is disclosed as one example of application of this technique. The MOS type field-effect transistor is different from that shown in FIG. 2 in that a single crystal aluminum interconnection layer 39 is formed over the oxide insulating film 15 including on the inner peripheral wall and on a bottom surface of a contact hole 38 with a single crystal silicon layer 37 interposed therebetween, and furthermore, a single crystal CoSi$_2$ film 40 for reducing the contact resistance is formed on the surface of the source/drain regions 14. Other structures are the same as those shown in FIG. 2, so that the description thereof will not be repeated while giving them the same reference numerals.

"JAPANESE JOURNAL OF APPLIED PHYSICS, VOL. 27, NO. 9, SEPTEMBER, 1988, at pp. L1775-L1777" explains the fact that a single crystal aluminum layer can be formed on a single crystal silicon layer, as disclosed in the above-mentioned publication and the like.

In accordance with the conventional technique described in the above-mentioned publication and like references, in the structures shown in FIGS. 4 and 5 a problem is that the single crystal silicon layers 34, 37 which are formed as underlying portions of the aluminum interconnection layers 33, 39 are also formed on the bottom surfaces of the contact holes 35, 38, so that the contact resistances in these portions are increased. This is because the sheet resistance values of the single crystal silicon layers 34, 37 are much larger than the sheet resistance value of the aluminum thin film.

SUMMARY OF THE INVENTION

An object of the invention is to provide a semiconductor device with a conductive metal interconnection in which electromigration along a grain boundary is prevented by causing a conductive metal interconnection layer such as by aluminum to be a single crystal structure or making the size of the crystal grains large.

The semiconductor device in accordance with the present invention includes a conductive layer, an insulating film formed on the surface of the conductive layer and having a contact hole formed over the conductive layer, and a conductive metal interconnection layer formed on the insulating film and electrically connected to the conductive layer through the contact hole formed in the insulating film. The semiconductor device is characterized in that the conductive metal interconnection and the surface of the conductive layer are directly joined together, and a silicon layer including a single crystal, or a polycrystal having the size of the crystal grains made larger to be at least about 10 $\mu$m or above, is interposed between the conductive metal interconnection layer and the insulating film.

In accordance with the semiconductor device having the above-mentioned structure, the conductive metal interconnection layer and the surface of the conductive layer are directly joined together and there is interposed a silicon layer which is changed to be a single crystal, or has the diameter of its crystal grains increased to at least about 10 $\mu$m or above, between the conductive metal interconnection layer and the insulating film. As a result, the conductive metal interconnection layer is affected by the properties of crystal of the silicon layer which is an underlying portion thereof, and changed to be a single crystal or a polycrystal having the size of its crystal grains of a size of about 10 $\mu$m or above. Normally, the diameter of a contact hole is on the order of about 1 $\mu$m, so that the inner portion of the contact hole and the conductive metal interconnection layer in the vicinity thereof are also changed to be a single crystal or have a large size of crystal grains as they are in contact with a silicon layer which has been changed to be a single crystal or have a large size of crystal grains in other major region though they are in contact with the amorphous insulating film in the inner peripheral wall. Therefore, in the conductive metal interconnection layer of the entire region including the inner portion of the contact hole, no grain boundary is caused or, at most, extremely few grain boundaries are caused. As a result, migration of atoms of the conductive metal due to electromigration along the crystal boundary is controlled and the electromigration-resistant characteristic is improved. The conductive metal interconnection layer and the conductive layer are directly joined together in the bottom portion of the contact hole, so that the sheet resistance value in the joint portion can be kept extremely low.

The method of manufacturing the semiconductor device in accordance with the present invention includes the steps of depositing an insulating film on the surface of a conductive layer, forming a silicon layer including a polysilicon or an amorphous silicon on the surface of the insulating film, forming a contact hole in a predetermined position of the silicon layer and the insulating layer so that the surface of the conductive layer may be exposed, forming a conductive metal interconnection layer on the surface of the silicon layer including the surface of the inner portion of the contact hole, and patterning the conductive metal interconnection layer and the silicon layer as required. The manufacturing method of the semiconductor device is characterized in that it includes a step of a thermal treatment for changing the silicon layer to be a single crystal or a polycrystal having a grain size of at least about 10 $\mu$m or above at predetermined time before the step of forming the conductive metal interconnection layer and after the step of forming the silicon layer.

The semiconductor device having the above-mentioned structure may be manufactured with high productivity by following the above-described steps. That is, a silicon layer of a single crystal or a polycrystal having a grain size of about 10 $\mu$m or above may be readily formed by applying a predetermined thermal treatment to the polycrystal silicon layer or the amorphous silicon layer formed on the surface of the insulating film. Therefore, the conductive metal interconnection layer formed thereafter is affected by the property of crystalline structure of the underlying portion and is also changed to a single crystal or a polycrystal having a grain size of about 10 $\mu$m or above. When the contact hole is formed so that the surface of the conductive layer may be exposed in a predetermined position before forming the conductive metal interconnection layer, after a polycrystal silicon layer or an amorphous silicon layer is formed on the insulating film, the conductive metal interconnection layer and the surface of the conductive layer to be formed after that are directly joint together.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiment in accordance with the present invention will now be described in the following with reference, to the drawings.

Figure 6:
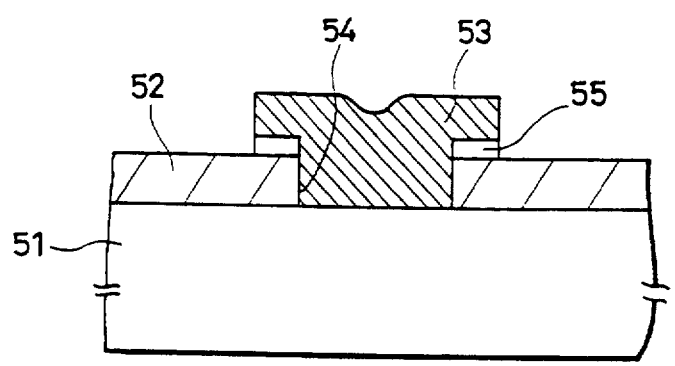
FIG. 6 is a cross-sectional view showing a structure in the vicinity of a contact hole in accordance with a first embodiment of the present invention.

FIG. 6 shows a structure of a cross-section in the vicinity of a contact hole 54 in accordance with an embodiment in which the present invention is applied to a structure where an aluminum interconnection layer 53 is formed over the surface of a semiconductor substrate 51 with an oxide insulating film 52 interposed therebetween, and the surface of the semiconductor substrate 51 and the aluminum interconnection layer 53 are electrically connected to each other through the contact hole 54 formed in the oxide insulating film 52. In this embodiment, a single crystal silicon layer 55 is interposed between the upper surface of the oxide insulating film 52 and the aluminum interconnection layer 53. The contact hole 54 is formed through both the insulating film 52 and the silicon layer 55. Note that, as shown in FIG. 6, the single crystal silicon layer 55 is disposed around and outside the contact hole 54.

In accordance with the structure of the embodiment, the aluminum interconnection layer 53 is affected by the properties of crystal of the single crystal silicon layer 55 that serves as an underlying portion and is changed to be a single crystal. While the aluminum interconnection layer 53 is out of contact with the single crystal silicon layer 55 on the surface of the inner portion of the contact hole 54, the contact hole 54 has an inside diameter of about 1 $\mu$m or below, so that its size is extremely small compared with other regions where the aluminum interconnection layer 53 is formed. Therefore, the aluminum interconnection layer 53 inside the contact hole 54 is also changed to be a single crystal under the influence of the periphery thereof being changed to a single crystal. As a result, no grain boundary appears in the vicinity of the contact hole 54 and electromigration mainly generated along a grain boundary can be prevented.

A silicon layer of a polycrystal having a grain size of about 10 $\mu$m or above may be used in place of the single crystal silicon layer 55 in accordance with the above-described embodiment. In this case, the aluminum interconnection layer 53 is also changed to a polycrystal having its grain size of about 10 $\mu$m or above under the influence of the properties of crystal of the crystal silicon layer 55. In this case, as the inside diameter of the contact hole 54 is normally about 1 $\mu$m or below, the aluminum interconnection layer 53 inside the contact hole 54 is changed to have its grain size increased under the influence of the periphery and very few crystal boundaries are generated inside the contact hole 54. As a result, it is also possible to prevent the electromigration.

Figure 7:
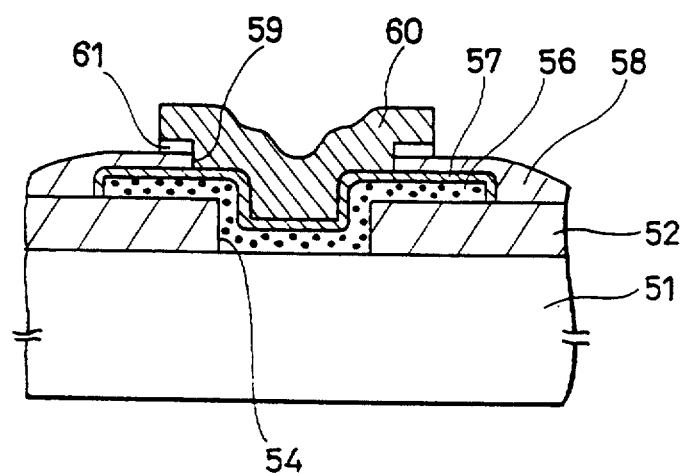
FIG. 7 is a cross-sectional view showing a structure in the vicinity of a contact hole in accordance with a second embodiment of the present invention.

FIG. 7 shows a cross-sectional structure in accordance with an embodiment in which the present invention is applied to a structure where a metal silicide layer 57 is formed on the surface of a polysilicon interconnection layer 56 having a contact portion with the surface of the semiconductor substrate 51 through the contact hole 54, and an aluminum interconnection layer 60 is further formed over that with an oxide insulating film 58 interposed therebetween, which is in contact with the metal silicide layer 57 through a contact hole 59. In this embodiment, a crystal silicon layer 61 is interposed between the upper surface of the oxide insulating film 58 and the aluminum interconnection layer 60. Note that, as shown in FIG. 7, the silicon layer 61 is disposed around and outside the contact hole 59. The crystal silicon layer 61 is a single crystal or a polycrystal having a grain size of about 10 $\mu$m or above similarly to the above-mentioned crystal silicon layer 55 shown in FIG. 6, and an effect by the crystal silicon layer 61 is the same as the effect of the crystal silicon layer 55 in the embodiment shown in FIG. 6.

A method of forming the structure in accordance with the embodiment shown in FIG. 6 will now be described with reference to FIGS. 8A to 8F.

Figure 8A:
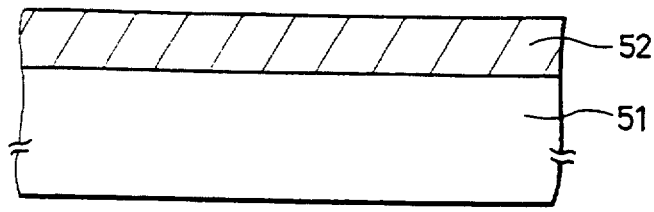
FIGS. 8A, 8B, 8C, 8D, 8E, and 8F are cross-sectional views sequentially showing one example of a manufacturing step of forming the structure in accordance with the first embodiment shown in FIG. 6.
Figure 8B:
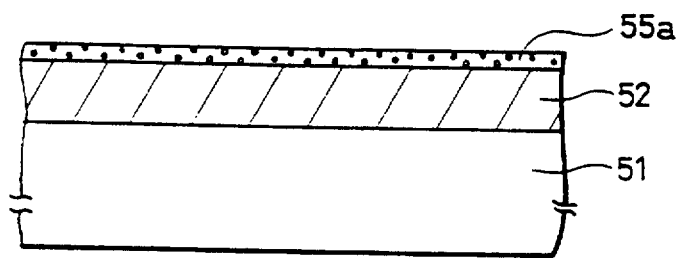
Figure 8C:
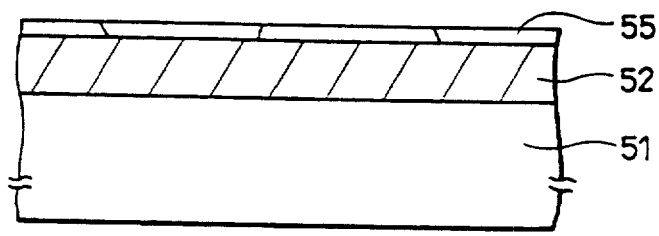

First, an oxide insulating film 52 such as SiO$_2$ or the like is deposited on the semiconductor substrate 51 to have a thickness of several thousand Å by the CVD method or the like (see FIG. 8A). After that, the polysilicon layer 55a is formed on the surface of the oxide insulating film 52 to have a thickness of the order of several thousand Å, for example, by the CVD method or the like (see FIG. 8B). Under this state, the polysilicon layer 55a has a polycrystalline structure having a grain size of 1 $\mu$m or below. Then, a thermal treatment is applied for changing the polysilicon layer 55a to become a single crystal or a polycrystal having a grain size of about 10 $\mu$m or above. The thermal treatment is conducted, for several tens of minutes to several, at a temperature of 800° C.-1200° C. The crystal is caused to have a larger grain size by this thermal treatment because the reaction between adjacent crystal grains of polysilicon is promoted. FIG. 8C shows the crystal silicon layer 55 in a state of polycrystal having a grain size of several tens of μm.

The crystal silicon layer 55 having an increased grain size can be obtained by depositing an amorphous silicon on the oxide insulating film 52 by the CVD method or the like in place of the polysilicon layer 55a, implanting the same with material such as silicon atoms to form a core, and applying the above-mentioned thermal treatment thereto. Furthermore, the crystal silicon layer 55 having an increased grain size can be also obtained by depositing an extremely thin polysilicon film of hundreds of Å on the insulating film 52, epitaxial-growing amorphous silicon thereon, and then applying the above-mentioned thermal treatment.

Figure 8D:
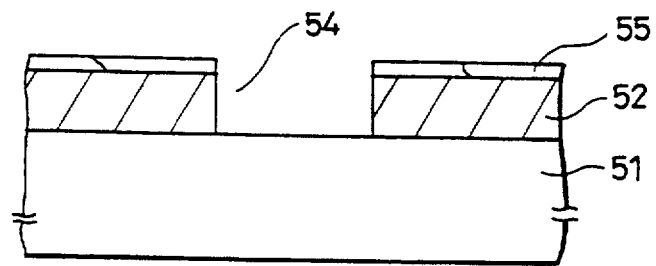
Figure 8E:
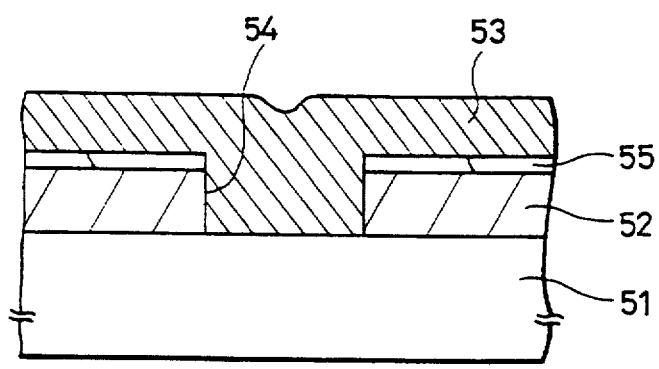

Then, a resist mask having a predetermined pattern (not shown) is formed by a photolithography technique, and the contact hole 54 is formed by applying etching to remove the resist mask (see FIG. 8D). The inside diameter of the contact hole 54 is normally about 1 μm or below. After that, the aluminum interconnection layer 53 is formed over the entire surface of the semiconductor substrate 51 including the inner portion of the contact hole 54 by the CVD method (see FIG. 8E). In the process of forming the aluminum interconnection layer 53 by the CVD, the aluminum interconnection layer 53 is also changed to become a single crystal or a polycrystal having a grain size of about 10 μm or above under the influence of the properties of crystal of the underlying crystal silicon layer 55.

It is also possible to form the aluminum interconnection layer 53 by a sputtering method instead of the CVD method. In this case, the aluminum interconnection layer 53 of a single crystal or a polycrystal having its grain size of about 10 μm or above can be formed by sputtering the aluminum, heating the semiconductor substrate 51 at a temperature of 100° C.-600° C., preferably 200° C.-300° C.

Figure 8F:
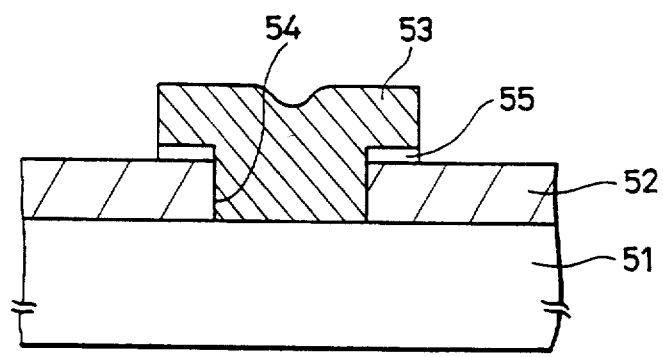
Figure 9A:
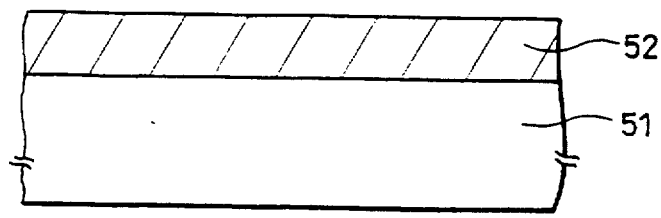
FIGS. 9A, 9B, 9C and 9D are cross-sectional views sequentially showing an example of another manufacturing step for forming the structure in accordance with the first embodiment.
Figure 9B:
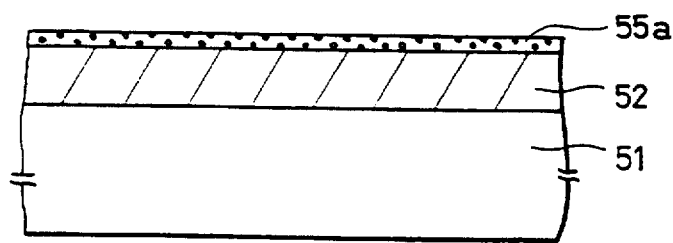
Figure 9C:
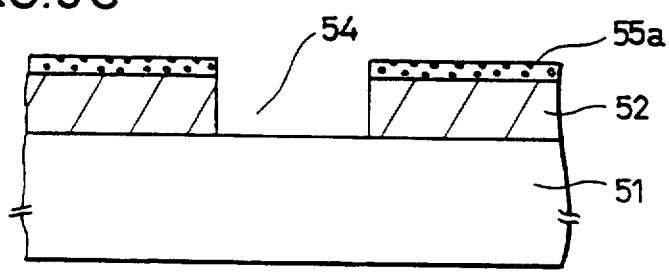
Figure 9D:
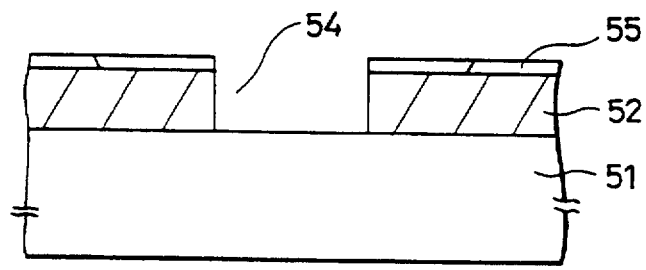

Then, the aluminum interconnection layer 53 and the crystal silicon layer 55 are patterned as required (see FIG. 8F).

Figure 4:
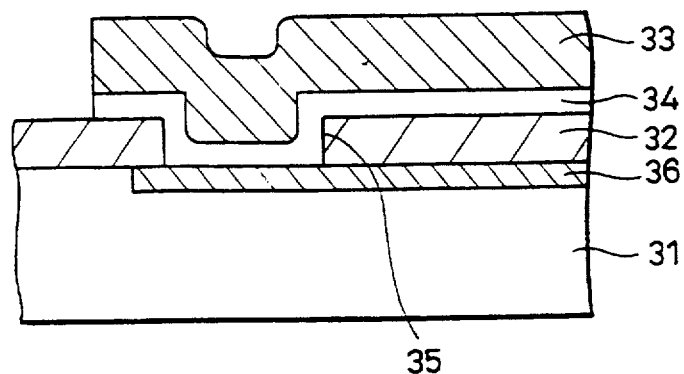
FIG. 4 is a cross-sectional view showing a conventional structure having a single crystal silicon layer as an underlying portion of an aluminum interconnection when an aluminum interconnection layer is formed over a semiconductor substrate with an oxide insulating film interposed therebetween.
Figure 5:
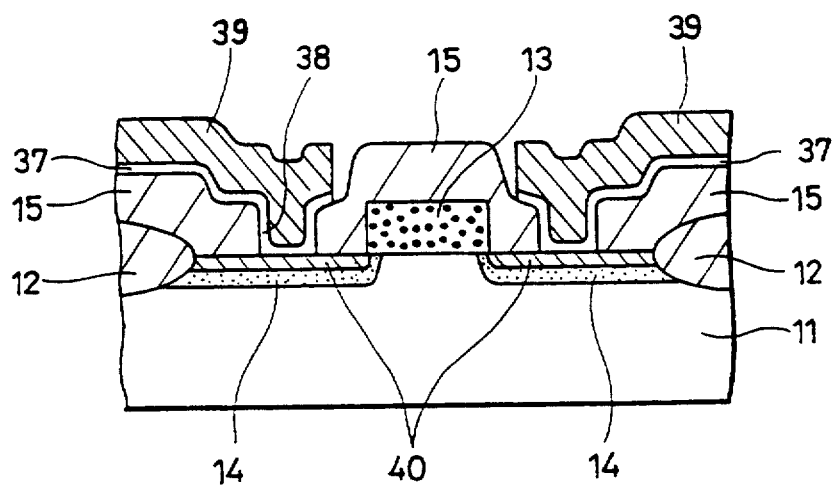
FIG. 5 is a cross-sectional view showing a structure of a conventional MOS type field-effect transistor having a single crystal silicon layer as an underlying portion of an aluminum interconnection layer electrically connected to source-drain regions.

The aluminum interconnection layer 53 formed in accordance with the above-mentioned manufacturing process includes a single crystal or a polycrystal having a grain size of about 10 μm or above, so that various phenomena due to electromigration mainly generated along a grain boundary may be controlled. While the aluminum interconnection layer 53 is directly in contact with the insulating film 52 and the semiconductor substrate 51 without the crystal silicon layer 55 interposed therebetween in the inner side and the bottom surface of the contact hole 54, the inside diameter of the contact hole 54 is normally about 1 μm or below, so that very few grain boundaries are generated inside the contact hole as the aluminum interconnection layer 53 is changed to become a single crystal or to have a larger grain size under the influence of the crystal silicon layer 55 in the periphery of the contact hole 54. Therefore, electromigration is also prevented at the inside of the contact hole 54, and furthermore, the aluminum interconnection layer 53 and the semiconductor substrate 51 are directly in contact with each other, so that the contact resistance can be kept low compared with the conventional technique shown in FIG. 4 in which the single crystal silicon layer 34 is interposed, contact portion. The sheet resistance of the single crystal silicon layer 34 is much more than, the sheet resistance of the aluminum.

The above-described structure shown in FIG. 6 can also be formed by the steps of FIG. 9A to 9D. In these forming steps, the steps of firstly depositing the oxide insulating film 52 on the semiconductor substrate 51 (see FIG. 9A), and then forming the polysilicon layer 55a thereon (see FIG. 9B) are the same as the steps shown in FIGS. 8A and 8B above. In these forming steps, before the step of applying a thermal treatment for changing the polysilicon layer 55a to a single crystal or to have a larger grain size, the contact hole 54 is formed (see FIG. 9C), and then a thermal treatment is applied for several tens of minutes to several hours at a temperature of 800° C.-1200° C. The thermal treatment causes the crystal silicon layer 55 including a single crystal or a polycrystal having a grain size of about 10 μm or above to be formed, as in the structure shown in FIG. 8D (see FIG. 9D). The steps of forming the aluminum interconnection layer 53 after that are the same as the steps shown in FIGS. 8E and 8F.

Figure 10:
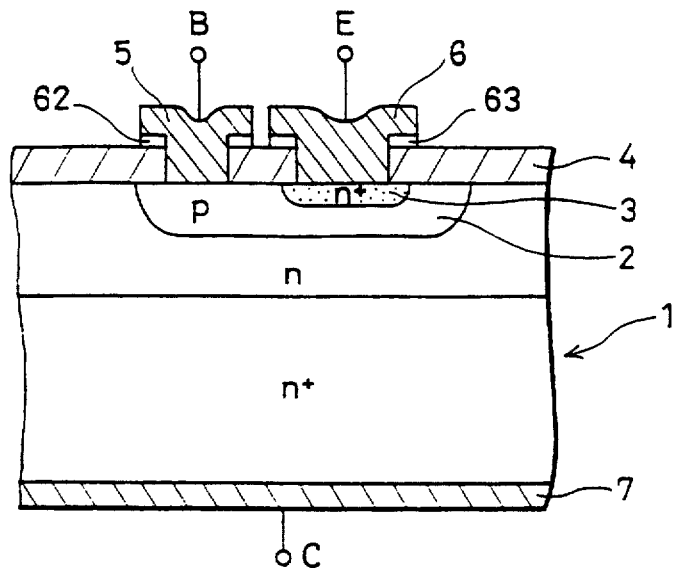
FIG. 10 is a cross-sectional view showing a structure in which the present invention is applied to a bipolar transistor.
Figure 11:
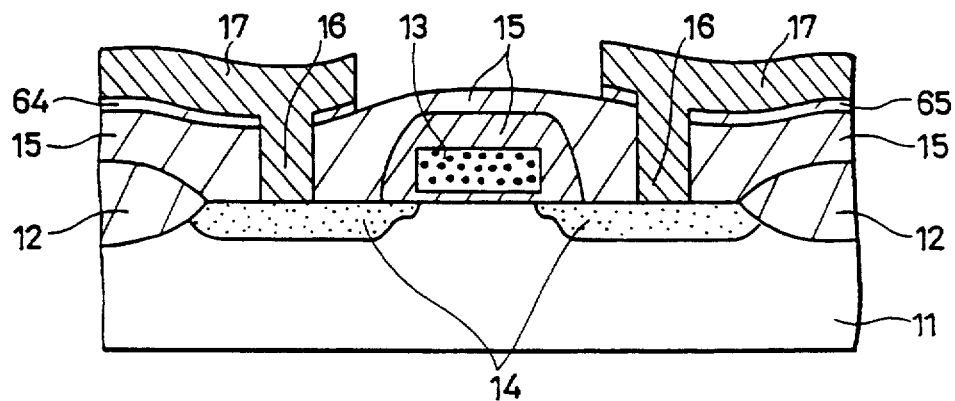
FIG. 11 is a cross-sectional view showing a structure in which the present invention is applied to a MOS type field-effect transistor.

A description will now be provided of an example in which the present invention is applied to an actual semiconductor device with reference to FIGS. 10 and 11.

Figure 1:
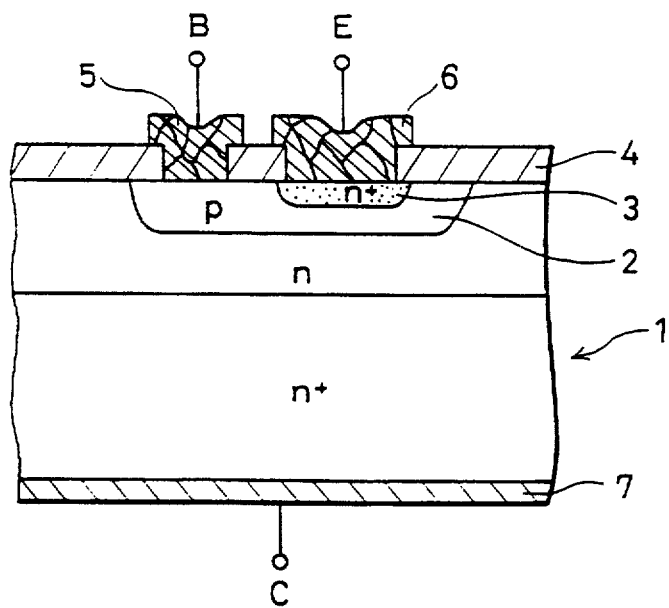
FIG. 1 is a cross-sectional view showing a structure of a typical conventional bipolar transistor.

FIG. 10 shows one example of a structure in which the present invention is applied to a bipolar transistor of the same type as that shown in FIG. 1. The same elements as those in the structure shown in FIG. 1 are labelled the same and a detailed description thereof will not be repeated. The structure shown in FIG. 10 is different from that in FIG. 1 in that crystal silicon layers 62, 63 are interposed between the upper surface of the oxide insulating film 4 and the aluminum interconnection layers 5, 6, respectively. The crystal silicon layers 62, 63 are formed in accordance with the same steps as those for the crystal silicon layer 55 shogun in the embodiment above, and include a single crystal or a polycrystal having a grain size of about 10 μm or above. Therefore, they are affected by the properties of crystal of the crystal silicon layers 62, 63 which are the underling portions of the aluminum interconnection layers 5, 6 and changed to be a single crystal or a polycrystal having a grain size of about 10 μm or above, so that the electromigration-resistant characteristic may be improved. Since a bipolar transistor has the operation of the transistor conducted by current control, migration of aluminum atoms due to electromigration is generated as a particularly noticeable problem. Thus the present invention can be practiced very effectively.

Figure 2:
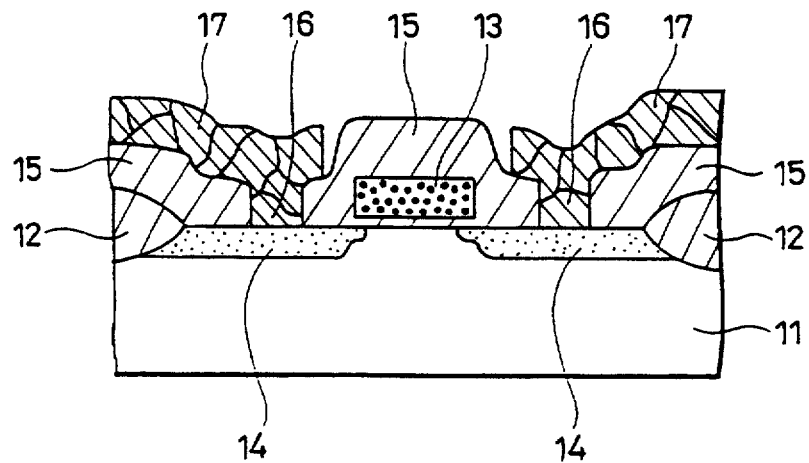
FIG. 2 is a cross-sectional view showing a structure of a conventional MOS type field-effect transistor.
Figure 3A:
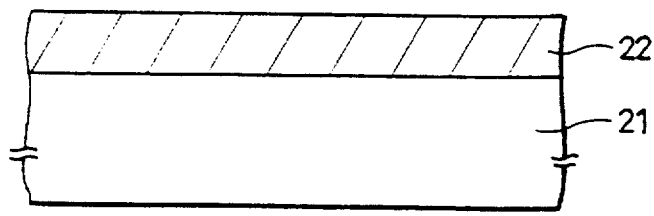
FIGS. 3A, 3B, 3C, and 3D are cross-sectional views sequentially showing the step of forming an aluminum interconnection layer over a semiconductor substrate with an insulating film interposed therebetween, in the vicinity of a contact portion of the semiconductor substrate and the aluminum interconnection layer.
Figure 3B:
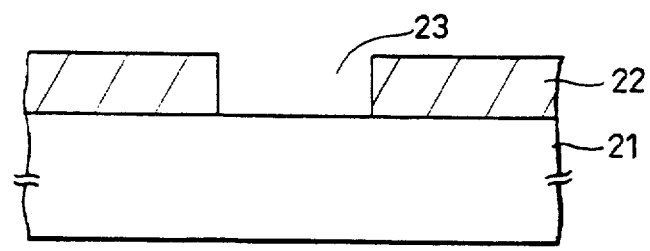
Figure 3C:
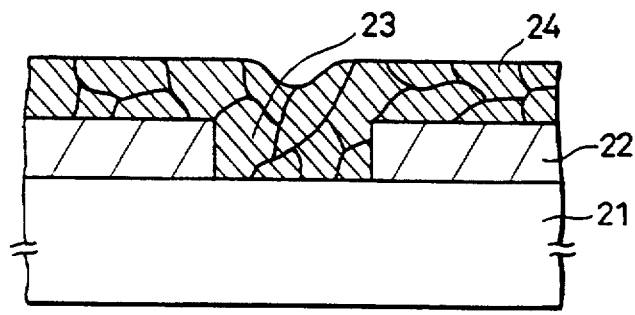
Figure 3D:
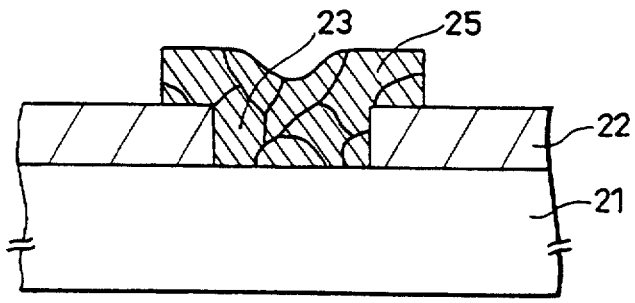

FIG. 11 shows one example of a structure in which the present invention is applied to a MOS type field-effect transistor which is almost the same as that shown in FIG. 2. Also, in this structure, the structural elements common to those shown in FIG. 2 are given the same reference numerals and a description thereof will not be repeated here. The structure shown in FIG. 11 is different from that in FIG. 2 in that crystal silicon layers 64, 65 are interposed between the upper surface of the oxide insulating film 15 and the aluminium interconnection layer 17. The crystal silicon layers 64, 65 are also formed in accordance with the same forming steps as those for the crystal silicon layer 55 in the embodiment above, and have an effect on change of the aluminum interconnection layer 17 to be a crystal, so that the electromigration-resistant characteristic may be improved.

Figure 12:
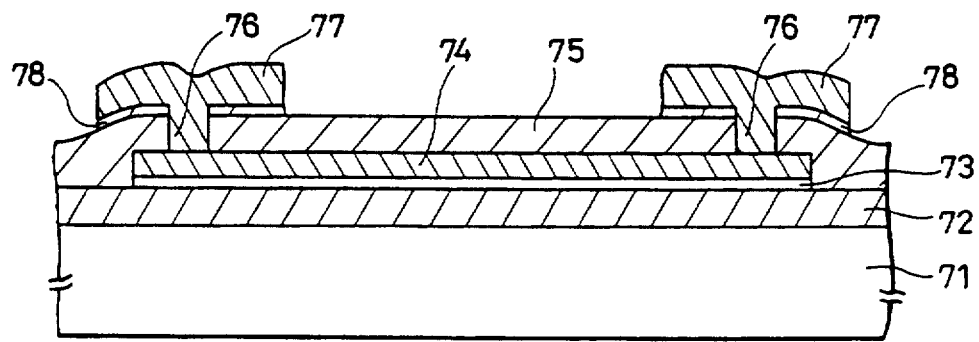
FIG. 12 is a cross-sectional view showing a structure in which the present invention is applied to a multilayer interconnection including an aluminum interconnection layer.

FIG. 12 shows one example of a structure in which the present invention is applied to a general multilayer aluminum interconnection structure. In this application, a first aluminum interconnection layer 74 is formed over the surface of a semiconductor substrate 71 with an insulating film 72 interposed therebetween and, furthermore, a crystal silicon layer 73 serves as an underlying portion thereof. While not shown in FIG. 12, the first aluminum interconnection layer 74 and the semiconductor substrate 71 are electrically connected to each other through a contact hole formed in a predetermined position of the oxide insulating film 72 and the present invention is applied in the vicinity of the contact hole. Furthermore, a second aluminum interconnection layer 77, electrically connected to the first aluminum interconnection layer 74 through a contact hole, is formed over the first aluminum interconnection layer 74 with the oxide insulating film 75 interposed therebetween. A crystal silicon layer 78, serving as an underlying portion, is interposed between the upper surface of the oxide insulating film 75 and the lower surface of the second aluminum interconnection layer 77, which is formed in accordance with the same steps as those for the crystal silicon layer 55 in the embodiment above. Under the influence of the properties of crystal layer 55, the second aluminum interconnection layer 77 is changed to become a single crystal or a polycrystal having a grain size of about 10 μm or above, so that its electromigration-resistant characteristic may be improved.

While a description was provided of a case in which an aluminum interconnection layer is used as a conductive metal interconnection layer in each of the above-described embodiments, the present invention can be also applied to a case in which a conductive interconnection layer is formed by a conductive metal such as gold or copper in place of aluminum.

Although the present invention has been described and illustrated in detail, it should be clearly understood that the same is by way of illustration and example only and is not to be taken by way of limitation, the spirit and scope of the present invention being limited only by the terms of the appended claims.

What is claimed is:

1. A semiconductor device, comprising:
    a conductive layer;
    an insulating film formed on a surface of the conductive layer and having a contact hole formed over the conductive layer;
    a conductive metal interconnection layer formed on the insulating film and electrically connected to the conductive layer through the contact hole of the insulating film; and
    a single-crystal silicon layer outside the contact hole, interposed between the conductive metal interconnection layer and the insulating film.

2. The semiconductor device according to claim 1, wherein: said conductive layer and said conductive metal interconnection layer are directly joined together in the bottom portion of said contact hole.

3. The semiconductor device according to claim 1, wherein: a polysilicon layer and a metal silicide layer are stacked and interposed in the electrically connecting portion of said conductive layer and said conductive metal interconnection layer.

4. The semiconductor device according to claim 1, wherein:
    said conductive layer is a layer of a selected conductivity type formed on the surface of the semiconductor substrate, and
    said conductive metal interconnection layer is an aluminum interconnection layer for electrically connecting said well and an external element.

5. The semiconductor device according to claim 1, wherein:
    said conductive layer includes source/drain regions of a MOS type field-effect transistor, and
    said conductive metal interconnection layer is a conductive interconnection layer for electrically connecting said source/drain regions and external element.

6. The semiconductor device according to claim 1, wherein:
    said conductive layer is a first conductive aluminum interconnection layer and said conductive metal interconnection layer is a second conductive aluminum interconnection layer formed with said insulating film and said silicon layer interposed therebetween.

7. A semiconductor device, comprising:
    a conductive layer;
    an insulating film formed on a surface of the conductive layer and having a contact hole formed over the conductive layer;
    a conductive metal interconnection layer formed on the insulating film and electrically connected to the conductive layer through the contact hole of the insulating film; and
    a polycrystal silicon layer outside the contact hole, interposed between the conductive metal interconnection layer and the insulating film, the polycrystal silicon layer having a grain size of at least about 10 μm.

8. The semiconductor device according to claim 1, wherein:
    said conductive layer is an impurity layer formed on the surface of the semiconductor substrate; and
    said conductive metal interconnection layer is an aluminum interconnection layer for electrically connecting said impurity layer and an external element.

9. The semiconductor device according to claim 7, wherein:
    said conductive layer is a first conductive aluminum interconnection layer and said conductive metal interconnection layer is a second conductive aluminum interconnection layer formed with said insulating film and said silicon layer interposed therebetween.

* * * * *